United States Patent
Hutson et al.

(10) Patent No.: US 11,342,912 B2
(45) Date of Patent: *May 24, 2022

(54) STRAY VOLTAGE DETECTION

(71) Applicant: Ubicquia LLC, Melbourne, FL (US)

(72) Inventors: Bradford Brian Hutson, Melbourne, FL (US); Gustavo Dario Leizerovich, Melbourne, FL (US)

(73) Assignee: Ubicquia, Inc., Fort Lauderdale, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/834,795

(22) Filed: Mar. 30, 2020

(65) Prior Publication Data

US 2020/0235732 A1 Jul. 23, 2020

Related U.S. Application Data

(63) Continuation-in-part of application No. 16/569,467, filed on Sep. 12, 2019.

(Continued)

(51) Int. Cl.
*H03K 17/61* (2006.01)
*H04W 4/80* (2018.01)
(Continued)

(52) U.S. Cl.
CPC ........... *H03K 17/61* (2013.01); *G06F 1/3206* (2013.01); *H02M 1/081* (2013.01); *H04W 4/80* (2018.02); *H05B 47/24* (2020.01); *H05B 47/26* (2020.01)

(58) Field of Classification Search
None
See application file for complete search history.

(56) References Cited

U.S. PATENT DOCUMENTS 9,746,498 B2 8/2017 Roberson
9,748,759 B1 8/2017 Bergeron et al.
(Continued)

FOREIGN PATENT DOCUMENTS

| GB | 2569664 A | * | 6/2019 | ............ B65D 90/10 |
| WO | 2019/136480 A2 | | 7/2019 | |
| WO | WO-2020064487 A1 | * | 4/2020 | ............ F21V 23/009 |

OTHER PUBLICATIONS

U S. Patent and Trademark Office, Notice of Allowability, as entered in connection with parent U.S. Appl. No. 16/569,467, dated Jun. 25, 2021 (12 pages).

*Primary Examiner* — Rexford N Barnie
*Assistant Examiner* — Terrence R Willoughby
(74) *Attorney, Agent, or Firm* — Daniel C. Crilly; Thomas Satagaj

(57) ABSTRACT

A processor-based device includes a chassis having a chassis ground node that is arranged to electrically couple the chassis to an earth ground. The device also includes a connector accessible from an exterior of the chassis. The connector conforms to a standardized powerline interface having a hot power signal, a load power signal, and a neutral power signal. A processor-based apparatus housed at least in part within the chassis is arranged to operate using DC power derived from AC power present at the powerline interface. A stray voltage detector is arranged to detect a stray voltage potential existing between the neutral power signal of the standardized powerline interface and the chassis ground node, and the processor-based device is arranged to communicate at least one indication of the detected stray voltage potential.

20 Claims, 8 Drawing Sheets

Related U.S. Application Data

(60) Provisional application No. 62/730,365, filed on Sep. 12, 2018.

(51) Int. Cl.
  *G06F 1/3206* (2019.01)
  *H02M 1/08* (2006.01)
  *H05B 47/24* (2020.01)
  *H05B 47/26* (2020.01)

(56) References Cited

U.S. PATENT DOCUMENTS

| | | | |
|---|---|---|---|
| 10,361,015 B1 | 7/2019 | Skidmore et al. | |
| 2009/0027281 A1* | 1/2009 | Walters | G01R 29/14 343/703 |
| 2009/0212965 A1* | 8/2009 | Becattini | H02H 3/14 340/660 |
| 2011/0221602 A1* | 9/2011 | Gelbien | G01R 29/24 340/660 |
| 2013/0040471 A1* | 2/2013 | Gervais | H05B 47/11 439/56 |
| 2014/0062338 A1* | 3/2014 | Zulim | H05B 47/18 315/307 |
| 2018/0087760 A1* | 3/2018 | Clynne | F21V 23/0471 |
| 2019/0107273 A1* | 4/2019 | Agrawal | H02M 7/02 |
| 2019/0350070 A1* | 11/2019 | Stuby, Jr. | H05B 47/11 |
| 2020/0043317 A1* | 2/2020 | Whitten | F21S 8/086 |
| 2020/0083883 A1 | 3/2020 | Hutson et al. | |

\* cited by examiner

STRAY VOLTAGE DETECTION

CROSS-REFERENCE TO RELATED APPLICATIONS

This continuation-in-part application claims the priority benefit of U.S. patent application Ser. No. 16/569,467, filed Sep. 12, 2019, which claims priority to U.S. Provisional Patent Application No. 62/730,365, filed Sep. 12, 2018. Each of these applications is hereby incorporated by reference in its entirety.

BACKGROUND

Technical Field

The present disclosure generally relates to a circuit for detecting stray voltage. More particularly, but not exclusively, the present disclosure relates to detecting stray voltage from a mains power circuit and providing an output when stray voltage is detected.

Description of the Related Art

Power lines transport electricity from one locale to another; sometimes over great distances. In many cases, the power lines pass over, through, or otherwise in proximity to areas populated by people and other living things. Often, the power lines are "tapped" to provide electricity at one or more points. This "tapping" permits power passing over the power lines to be diverted for consumption by streetlights, street signs, traffic lights, businesses, homes, and for other things.

One known issue with power lines is referred to herein as "stray voltage." In many power transmission systems, the power lines consist of one or more power carrying transmission conduits (e.g., "hot" lines, load lines, and the like) and one or more non-power carrying transmission conduits (i.e., "neutral" lines). A neutral line provides a reference plane for the one or more hot power lines, and typically, the neutral line provides a return path for the electricity consumed by the load device. Additionally, an exposed chassis of the load device will also be electrically coupled to earth ground. The earth ground connection is a protection device for lightning strikes and other conditions where an exposed chassis of the load device, the structures supporting the load device, and the like are spontaneously electrically coupled to a power source. In typical power transmission systems, each chassis and supporting pole structure will be electrically coupled to earth ground. It is known, however, that in cases of improper grounding, mis-wiring of equipment, equipment failure, failure in insulation around a hot power line conduit, capacitive coupling between energized lines and non-energized lines (e.g., un-connected adjacent wiring), and in other circumstances, a neutral line may become a power carrying conduit and/or the neutral line may become electrically coupled to the earth ground line. In these cases, an electric potential (i.e., the stray voltage) present on the earth ground line may be dangerous to people and other living things. Pedestrians, pets and others may come into contact with this stray voltage at a fence, a metal streetlight support, a traffic signal controller cabinet, a utility access cover, and even concrete surfaces of sidewalks or driveways may be dangerously electrified.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

The following is a summary of the present disclosure to provide an introductory understanding of some features and context. This summary is not intended to identify key or critical elements of the present disclosure or to delineate the scope of the disclosure. This summary presents certain concepts of the present disclosure in a simplified form as a prelude to the more detailed description that is later presented.

The device, method, and system embodiments described in this disclosure (i.e., the teachings of this disclosure) are directed to a circuit in a processor-based device that is directly coupled to mains power transmission lines. The processor-based device may, for example, be embodied as small-cell or some other smart device that is electromechanically couplable to a streetlight via a standardized socket integrated in the streetlight housing. The teaching of this disclosure discusses circuitry embodiments that detect and isolate stray voltage signals in or around the processor-based device housing, which may be dangerous to living things that contact the device or a structure (e.g., a ground line, a streetlight pole, a guide wire, or any other structure) that is electrically coupled to the device.

In a first embodiment, a processor-based device includes: a chassis having a chassis ground node, the chassis ground node arranged to electrically couple the chassis to an earth ground; a first connector accessible from an exterior of the chassis, the first connector including a set of first connector elements arranged to interface with a corresponding set of second connector elements of a second connector, wherein the first and second connector elements include a plurality of electrical signal conduits, wherein the first and second connectors conform to a standardized powerline interface, and wherein the standardized powerline interface includes at least a hot power signal, a load power signal, and a neutral power signal; a processor-based apparatus housed at least in part within the chassis, the processor-based apparatus arranged to operate using direct current (DC) power derived from alternating current (AC) power present at the powerline interface; and a stray voltage detector to detect, when the powerline interface is energized, a stray voltage potential between the neutral power signal of the standardized powerline interface and the chassis ground node, wherein the processor-based device is further arranged to communicate at least one indication of the detected stray voltage potential.

In at least some cases of the first embodiment, the standardized powerline interface conforms to a standard provided by the National Electrical Manufacturers Association (NEMA). In at least some cases, the second connector is integrated in a luminaire. In these or in other cases, the stray voltage detector, includes: a stray voltage isolation circuit; and a stray voltage measurement/processing circuit arranged to receive an output signal from the stray voltage isolation circuit and further arranged to assert an output when the output signal from the stray voltage isolation circuit crosses a certain threshold.

In at least some cases of the first embodiment, the stray voltage isolation circuit, includes an operational amplifier having an inverting input node, a non-inverting input node, and an output node, and the operational amplifier is configured to amplify a difference in voltage between the inverting input node and the non-inverting input node. Sometimes, the inverting input node of the operational amplifier is electrically coupled to the chassis ground node, and the non-inverting input node of the operational amplifier is electrically coupled to the neutral power signal. In some of cases, the stray voltage isolation circuit, includes a ground reference protection circuit arranged to electrically separate a digital circuit ground plane of the stray voltage detector from the chassis ground node, and in some cases, the stray voltage isolation circuit, includes at least one Zener diode electrically coupled to the output node of the operational amplifier.

In still other cases of the first embodiment, the stray voltage measurement/processing circuit is arranged to set a stray voltage threshold, determine when the stray voltage signal has crossed the stray voltage threshold, and communicate an alert based on the determination. In some of these cases, the alert includes at least one of an audio alert, a visual alert, and a short-range wireless alert, and in these or other cases, the alert includes at least one packetized message communicated toward a remote computing device via a cellular-based communication medium.

In a second embodiment, an apparatus that is arranged for attachment to a luminaire, the luminaire having one or more light emitting elements and a receptacle that conforms to a standardized powerline interface, includes: a housing; a connector accessible from an exterior of the housing, the connector including a set of connector elements that interface with corresponding receptacle elements of the receptacle of the luminaire; one or more processor-based devices housed at least in part within the housing, the one or more processor-based devices being operable by receiving direct current power relative to a digitally stable ground; and circuitry for detecting a stray voltage between the housing and a neutral power line signal passed through the connector.

In some cases of the second embodiment, at least one of the one or more processor-based devices is a wireless communications transceiver for sending and receiving wireless communication signals or a camera. In some cases, the apparatus further includes one or more sensors electronically communicatively coupled to the one or more processor-based devices. In some cases, the apparatus further includes a switching element and a photosensor arranged to provide an output that selectively causes the switching element to transition between a first state and a second state. The connector is in some cases compliant with American National Standards Institute (ANSI) C136.

In a third embodiment, a method includes: receiving, by a processor-based device, a hot power signal, a load power signal, and a neutral power signal passed via a connector compliant to a standardized powerline interface; producing a stray voltage signal with an operational amplifier by differentially amplifying at least a portion of the neutral power signal applied at a first input of the operational amplifier and at least a portion of an earth/chassis ground potential applied at a second input of the operational amplifier; detecting when the stray voltage signal or a representation of the stray voltage signal crosses a threshold; and asserting, by the processor-based device, an output based on the detecting.

In some cases of the third embodiment, the method further includes coupling the processor-based device to a receptacle of a luminaire, the receptacle being compliant with American National Standards Institute (ANSI) C136. And in these or other cases, the asserting comprises at least one of directing a light source to illuminate; directing an audio source to produce an alert sound; and communicating at least one packetized message toward a remote computing device via a cellular-based communication medium.

This Brief Summary has been provided to describe certain concepts in a simplified form that are further described in more detail in the Detailed Description. The Brief Summary does not limit the scope of the claimed subject matter, but rather the words of the claims themselves determine the scope of the claimed subject matter.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which.

DETAILED DESCRIPTION

The present disclosure may be understood more readily by reference to this detailed description and the accompanying figures. The terminology used herein is for the purpose of describing specific embodiments only and is not limiting to the claims unless a court or accepted body of competent jurisdiction determines that such terminology is limiting. Unless specifically defined in the present disclosure, the terminology used herein is to be given its traditional meaning as known in the relevant art.

In the following description, certain specific details are set forth in order to provide a thorough understanding of various disclosed embodiments. However, one skilled in the relevant art will recognize that embodiments may be practiced without one or more of these specific details, or with other methods, components, circuits, materials, etc. In other instances, well-known structures associated with computing systems including client and server computing systems, as well as networks have not been shown or described in detail to avoid unnecessarily obscuring more detailed descriptions of the embodiments.

The device, method, and system embodiments described in this disclosure (i.e., the teachings of this disclosure) are directed to a circuit in a processor-based device that is directly coupled to mains power transmission lines. The processor-based device may, for example, be embodied as small-cell or some other smart device that is electromechanically couplable to a streetlight via a standardized socket integrated in the streetlight housing. The teaching of this disclosure discusses circuitry embodiments that detect and isolate stray voltage signals in or around the processor-based device housing, which may be dangerous to living things that contact the device or a structure electrically coupled to the device.

Figure 1:
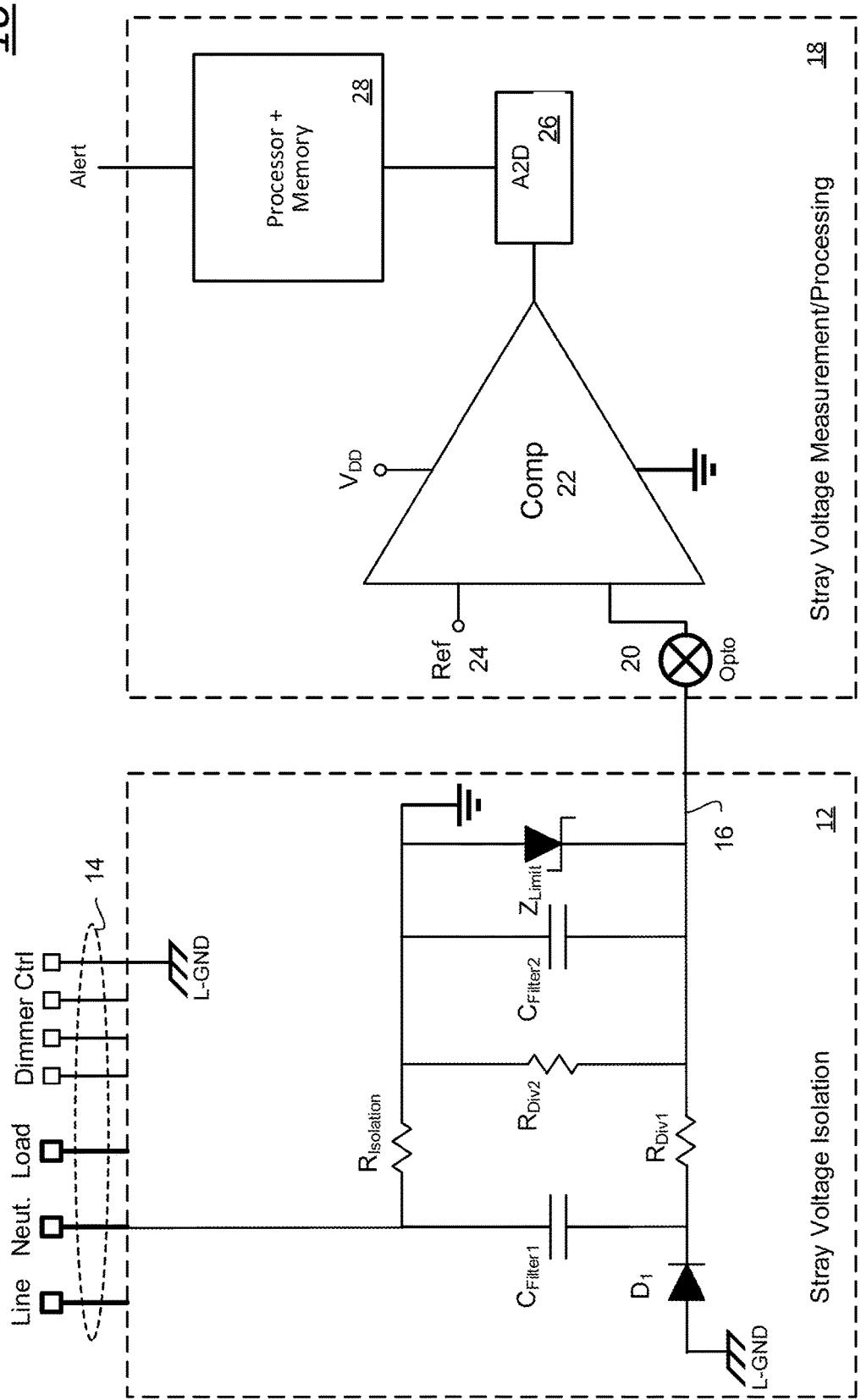
FIG. 1 is a stray voltage detector.

FIG. 1 is a stray voltage detector 10. The stray voltage detector 10 includes a stray voltage isolation circuit 12 and a stray voltage measurement and processing module 18. The stray voltage isolation circuit 12 includes a powerline interface 14, which in at least some cases is a standardized interface arranged to pass power transmission signals. The powerline transmission signals include a line power signal, a neutral power signal and a load power signal. In many cases, the standardized powerline interface 14 is arranged for use in a luminaire such as a streetlight. Accordingly, the standardized powerline interface 14 may in some cases be known as a NEMA interface, a NEMA socket, and NEMA connector, a connection system compliant with ANSI C136, a connector and receptacle system compliant with ANSI C136.41, or some other like terminology.

The standardized powerline interface 14 may also be arranged with a plurality of optional dimmer control signals. Four dimmer control signals are represented in the standardized powerline interface 14 of FIG. 1. In the circuit of FIG. 1, at least one dimmer control signal is electrically coupled to a chassis ground (e.g., lamp ground, L-GND). In this way, a physical ground signal that is electrically coupled to a housing of a certain device where the stray voltage detector 10 is operating is electrically available to the electronic circuits of the certain device.

When the circuitry of FIG. 1 is operating, the stray voltage isolation circuit 12 is arranged to isolate a stray voltage signal 16, which is a voltage potential realized between the neutral line of the standard power transmission signals, and the chassis ground L-GND of the certain device. This voltage potential may be caused by improper grounding, mis-wiring of equipment, equipment failure, failure in insulation around a hot power line conduit, capacitive coupling between energized lines and non-energized lines (e.g., unconnected adjacent wiring), an accident (e.g., a car accident that strikes a power pole and causes an energized powerline too short to the neutral line) or by some other circumstance.

In FIG. 1, the neutral powerline transmission signal is coupled to a voltage divider network, $R_{DIV1}$, $R_{DIV2}$. The neutral powerline transmission signal may be further coupled to one or more optional filtering capacitors $C_{Filter1}$, $C_{Filter2}$. A tap in the voltage divider provides a source voltage at the anode of a Zener diode $Z_{Limit}$, which, if such diode is included, is arranged as a protection device to limit the voltage of the stray voltage signal 16. The current path through the voltage divider and optional Zener diode $Z_{Limit}$ terminates at a ground plane. Correspondingly, a chassis line signal (e.g., L-GND) is half-wave rectified by a diode, and current limited by a resistor $R_{Isolation}$. The chassis line signal is coupled to the cathode of the Zener $Z_{Limit}$ diode and continues on as the voltage-limited stray voltage signal 16.

The stray voltage signal 16 is passed as an input to a stray voltage measurements/processing module 18. Because the stray voltage input signal 16 to the stray voltage measurements/processing module 18 is unregulated or otherwise unpredictable at least some of the time (e.g., lightning strike, maximum transmission line voltage, or the like), a coupling circuit 20 is used to protect the circuitry of the stray voltage measurement/processing module 18.

A comparator 22 in the stray voltage measurement/processing module 18 receives and compares the stray voltage signal 16 to a reference voltage signal 24. The output signal from the comparator 22 is an analog voltage signal that represents the difference between the reference voltage 24 and the isolated stray voltage signal 16. The output signal of the comparator 22 is converted by an A2D 26 to a digital value, which may directly represent the level of stray voltage potential or which may be used to calculate the level of stray voltage. A processor and associated memory 28 is used to either determine a discrete stray voltage level (e.g., 3 volts, 10 volts, 50 volts, 280 volts, or some other level) or a relative voltage level (e.g., "safe," "moderate," "dangerous," "extremely dangerous," or the like), which in appropriate circumstances is used to assert an output "Alert."

Figure 2A:
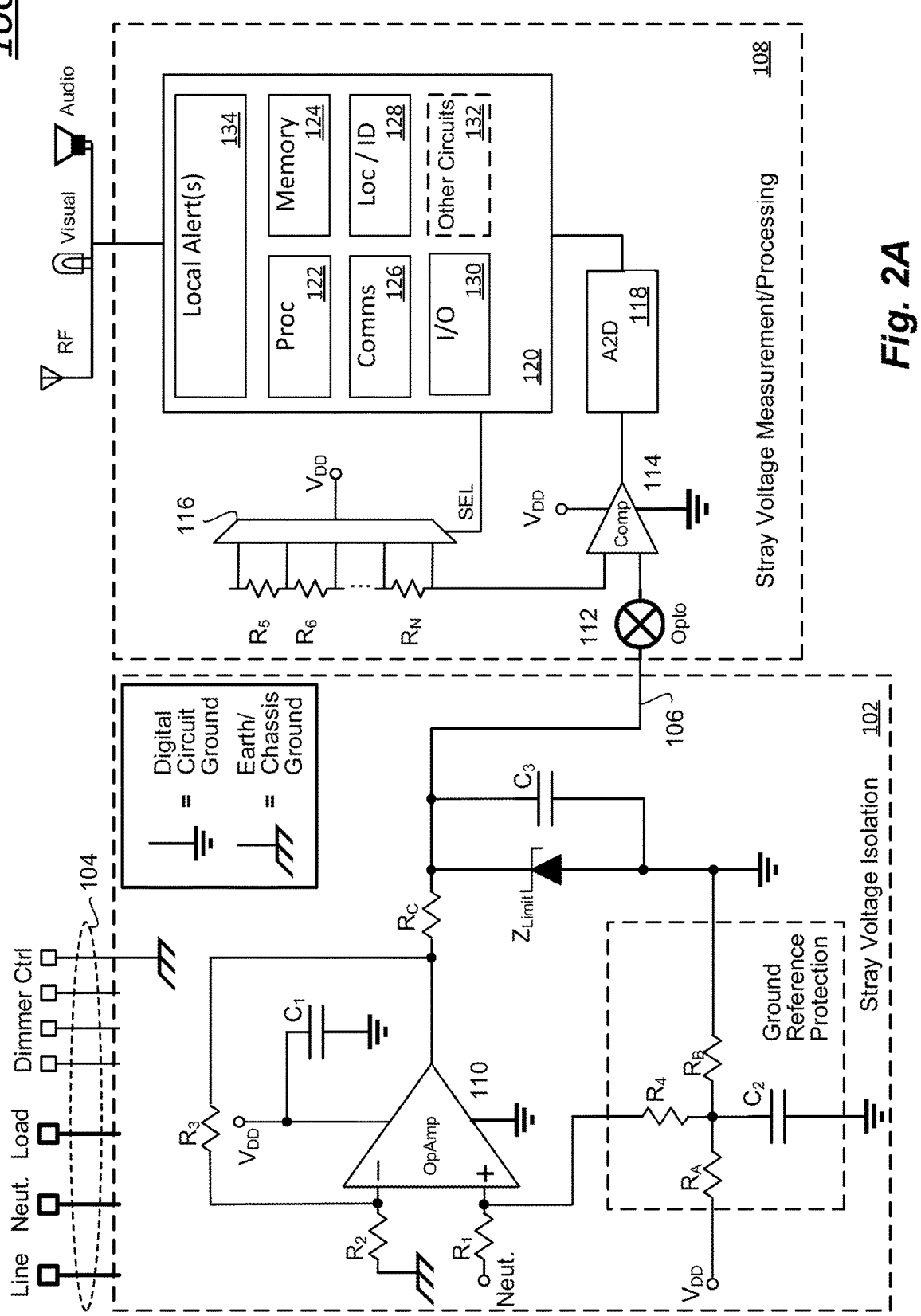
FIG. 2A is a schematic diagram of a stray voltage detection circuit and a processing module.
Figure 2B:
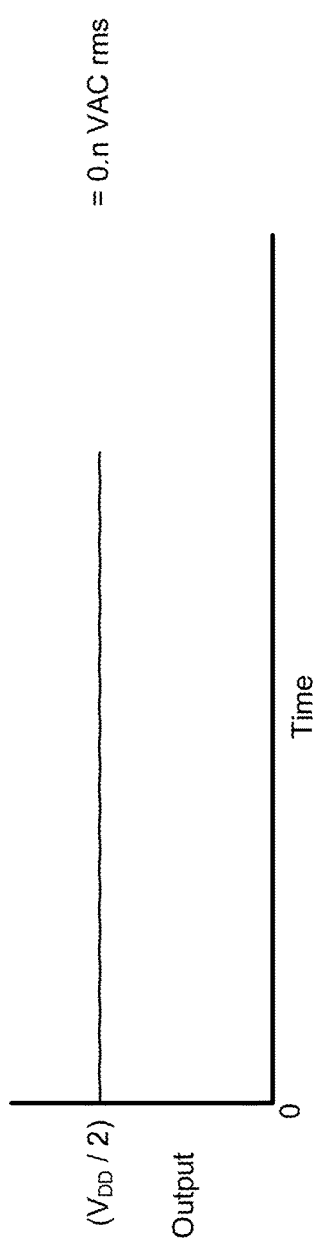
FIG. 2B a first output signal representation from the stray voltage isolation circuit of FIG. 2A.
Figure 2C:
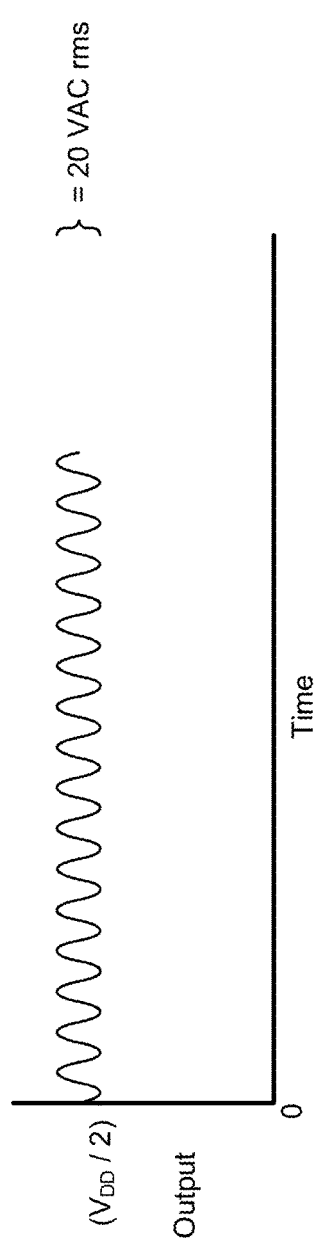
FIG. 2C a second output signal representation from the stray voltage isolation circuit of FIG. 2A.
Figure 2D:
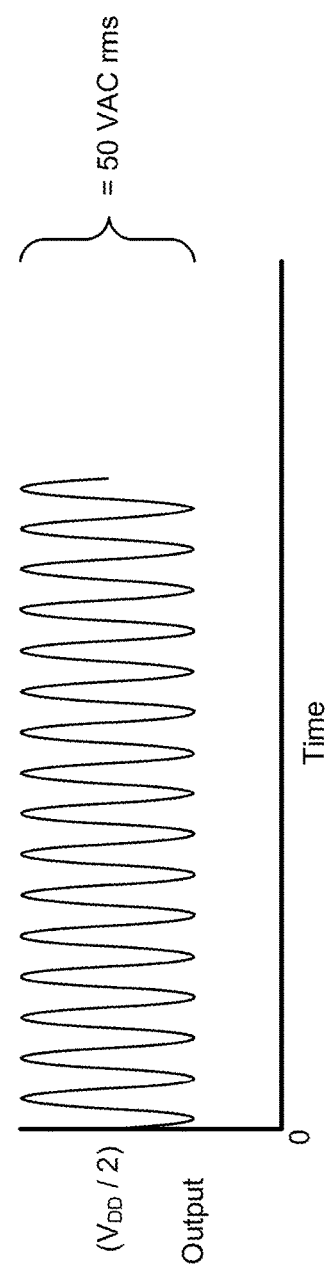
FIG. 2D a third output signal representation from the stray voltage isolation circuit of FIG. 2A.

FIG. 2A is a schematic diagram of a stray voltage detection and processing module 100. FIGS. 2B-2D are first, second, and third output signal representations, respectively, from the stray voltage isolation circuit of FIG. 2A. In the present disclosure, FIGS. 2A-2D may be individually or collectively referred to as FIG. 2. Structures earlier identified are not repeated for brevity.

The stray voltage detection and processing module 100 of FIG. 2A is a stray voltage detector along the lines of the stray voltage detector 10 of FIG. 1. The stray voltage detection and processing module 100 of FIG. 2A includes two portions. A first portion is a stray voltage isolation circuit 102, and a second portion is a stray voltage measurement/processing circuit 108. The stray voltage measurement/processing circuit 108 is arranged to receive an output signal 106 from the stray voltage isolation circuit 102 and further arranged to assert an output when the stray voltage signal 106 from the stray voltage isolation circuit 102 crosses a certain threshold. When the powerline interface is energized, the stray voltage detection and processing module 100 is arranged to detect a stray voltage potential between a neutral power signal of a standardized powerline interface and a chassis ground node of an underlying device that the stray voltage detection and processing module 100 is operating to protect.

The stray voltage isolation circuit 102 includes or is otherwise coupled to a powerline interface 104. In at least some cases, the powerline interface 104 is a standardized interface. In the embodiment of FIG. 2A, the standardized powerline interface 104 is arranged to pass a plurality of power transmission signals, which include a line power signal, a neutral power signal and a load power signal.

The standardized powerline interface 104 may also be arranged with a plurality of optional dimmer control signals. Four dimmer control signals are represented in the standardized powerline interface 104 of FIG. 2A. In some exemplary cases, four dimmer control signals permit two independent dimmer control channels. In other cases, a single dimmer control signal is a reference plane (e.g., an earth/chassis ground), and three separate dimmer channels are implemented. In yet other cases, the plurality of dimmer control lines is arranged to communicate encoded binary data, and in still other cases, the plurality of dimmer control lines implement a particular protocol (e.g., USB, I2C, SPI, or the like).

Figure 3:
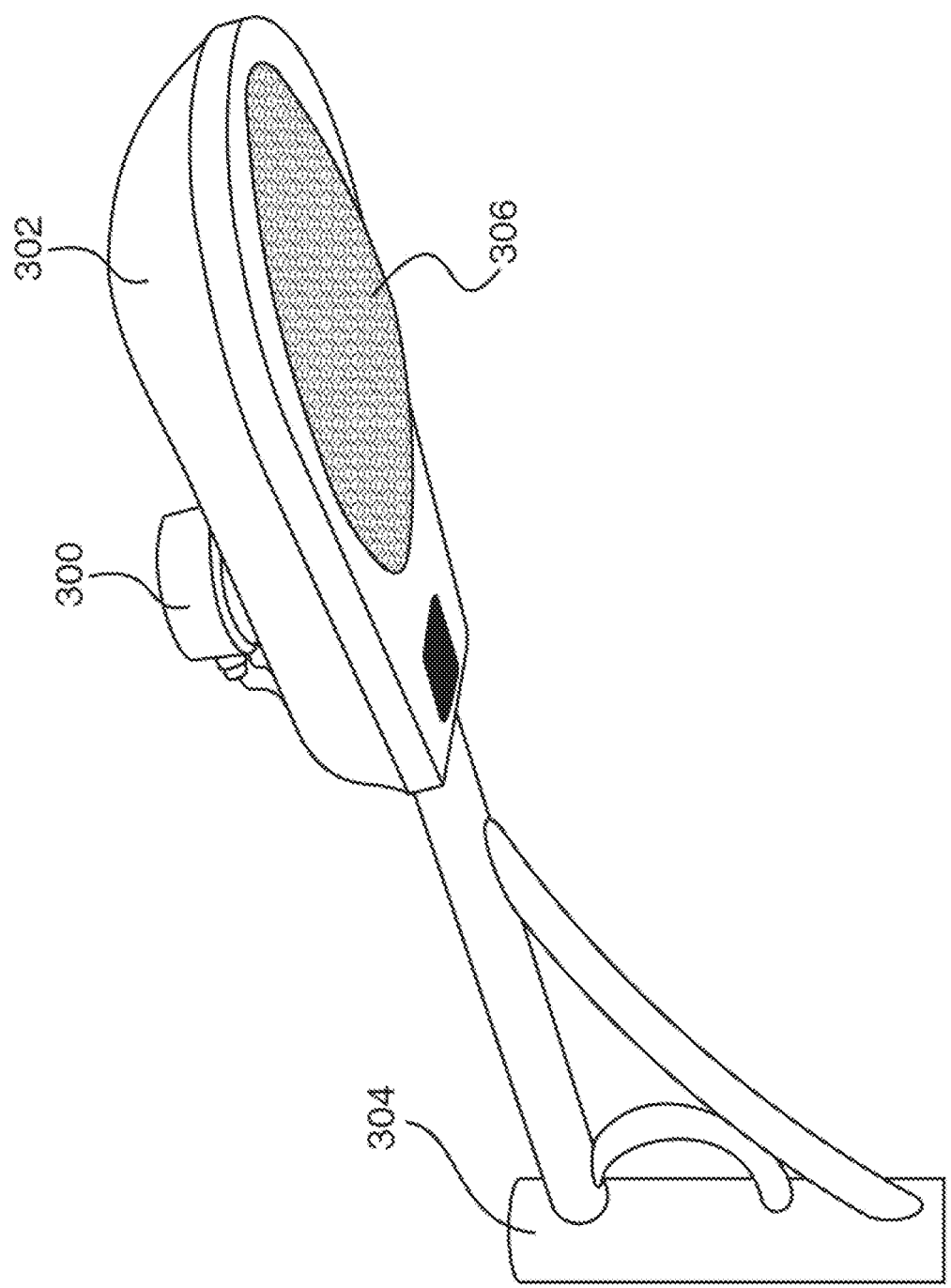
FIG. 3 is a processor-based device including the circuit of FIG. 2, the processor-based device being mounted on a light fixture.

In many cases, the standardized powerline interface 104 is arranged for use in a luminaire such as the streetlight of FIG. 3. Accordingly, the standardized powerline interface 104 may in some cases be known as a NEMA interface, a NEMA socket, and NEMA connector, or the like as discussed herein.

In the embodiment of FIG. 2A, at least one dimmer control signal is electrically coupled to a chassis ground (e.g., lamp ground, chassis ground, earth ground). In this way, a physical ground signal that is electrically coupled to a housing of a certain device where the stray voltage detection and processing module 100 is operating is electrically available to the electronic circuits of the certain device.

When the circuitry of FIG. 2A is operating, the stray voltage isolation circuit 102 is arranged to isolate a stray voltage signal 106, which is a voltage potential realized between the neutral line Neut. of the standard power transmission signals (e.g., via the standardized powerline interface 104), and the earth/chassis ground of the certain device. It is recognized that such a potential may be caused by improper grounding, mis-wiring of equipment, equipment failure, failure in insulation around a hot power line conduit, capacitive coupling between energized lines and non-energized lines (e.g., un-connected adjacent wiring), an accident (e.g., a car accident that strikes a power pole and causes an energized powerline too short to the neutral line) or by some other circumstance. This condition, which presents a voltage potential on the chassis of the certain device, may rise as high as the voltage potential between the line signal Line or load signal Load of the powerline interface 104 and the neutral line Neut. of the powerline interface 104. In at least some cases, the powerline interface 104 may be passing signals as high as 480 VAC or higher, and if even a fraction of this voltage signal is present on the chassis of the certain device, then persons, property, and other living things may be at great risk of electric shock, electrocution, or fire.

In FIG. 2A, the neutral powerline transmission signal Neut. is coupled to the non-inverting input (−) of an operational amplifier (OpAmp) 110 via a first voltage limiting resistor R1. In at least some cases, the first voltage limiting resistor R1 has a resistance value of between about 100,000 ohms (100 KΩ) and about 20 million ohms (20 MΩ). In at least some cases, the value of R1 is selected based on an anticipated maximum voltage that could be present on the neutral powerline transmission signal Neut.

Also in FIG. 2A, the earth/chassis ground signal is coupled to the inverting input (+) of OpAmp 110 via a second voltage limiting resistor R2. In at least some cases, the second voltage limiting resistor R2 has a resistance value of between about 100 KΩ and about 20 MΩ, though other values outside of this range are contemplated. In at least some cases, the value of R2 is selected based on an anticipated maximum voltage that could be present on the earth/chassis ground signal line. Because the stray voltage isolation circuit 102 is arranged to detect a stray voltage caused by a voltage potential on the neutral powerline transmission signal Neut. coming in contact with the earth/chassis ground signal line, the values of R1 and R2 are in at least some cases matched.

OpAmp 110 is arranged as a differential amplifier to amplify the difference in voltage between the inverting input (−) and the non-inverting input (+). A negative feedback loop via feedback resistor R3 applies a portion of the output voltage of OpAmp 110 back to the inverting input (−) to control the gain of OpAmp 110. The value of resistor R3 may be selected between about 10 KΩ and about 1 MΩ, though other values outside of this range are contemplated. One or more filtering capacitors C1 are arranged to condition the supply voltage $V_{DD}$ of OpAmp 110. Filtering capacitor C1 may have a value selected between about ten picofarads (10 pF) and about 100 microfarads (100 μF), though other values outside of this range are contemplated.

Generation of the supply voltage $V_{DD}$ is performed in a known way. The supply voltage $V_{DD}$ may be between about 1.8 volts and about 5 volts, though other values outside of this range are contemplated.

The stray voltage isolation circuit 102 includes a ground reference protection circuit. The ground reference protection circuit protects the stray voltage isolation circuit 102 and all other circuits of the certain device by electrically separating the digital circuit ground plane from the earth/chassis ground plane and thereby protecting OpAmp 110 and the other circuitry of the stray voltage detection and processing module 100 and the certain device from receiving an over-voltage condition during a high-stray voltage condition.

Additionally, the ground reference protection circuit sets a reference voltage for OpAmp 110. The ground reference protection circuit embodiment of FIG. 2A includes a voltage divider circuit RA, RB that sets a reference voltage, which is $V_{DD}$ or a fraction of $V_{DD}$. In at least some cases, RA and RB have values between about zero ohms (0Ω) and about 1 MΩ, though other values outside of this range are contemplated. Setting RA and RB to equal values will set a reference voltage to one half of $V_{DD}$ ($V_{DD}/2$). The ground reference protection circuit embodiment of FIG. 2A includes a voltage limiting resistor R4 and a filtering capacitor C2. The value of R4 in some cases is set between about 10 KΩ and about 2 MΩ, though other values outside of this range are contemplated. The value of C2 in some cases is set between about ten picofarads (10 pF) and about 100 microfarads (100 μF), though other values outside of this range are contemplated.

The output of OpAmp 110 represents stray voltage signal 106. In at least some cases, further protection circuitry is provided by any one or more of an isolation resistor RC, a filtering capacitor C3, and a Zener diode $Z_{Limit}$. The isolation resistor RC limits current of the stray voltage signal 106 and may be set to a value between about 0Ω and about 100 KΩ, though other values outside of this range are contemplated. The ground reference protection circuit embodiment of FIG. 2A provides a first voltage potential at the anode of the optional Zener diode $Z_{Limit}$, and the stray voltage signal 106 provides a second voltage potential at the cathode of Zener diode $Z_{Limit}$. In at least some embodiments, the optional Zener diode $Z_{Limit}$ has a turn-on voltage at about the level of $V_{DD}$. Accordingly, the Zener diode $Z_{Limit}$ may be included to protect the stray voltage measurements/processing circuit 108 from an over-voltage condition. Other circuits for forming the stray voltage signal 106 and for protecting the stray voltage measurements/processing circuit 108 are contemplated.

The stray voltage signal 106 is passed as an input to the stray voltage measurements/processing circuit 108. The stray voltage measurements/processing circuit 108 may optionally include an optical coupling circuit 112, a comparator circuit 114, a reference voltage selection circuit 116, an analog to digital converter (A2D) 118, and a microcontroller 120. The microcontroller 120 may optionally include a processor 122, memory 124, a communications module 126, a location/identification module 128 (e.g., global positioning system (GPS), MAC ID, IMEI module, or some other unique location or identification structure), an input/output (I/O) module 130, and certain other circuits 132. Additionally, the stray voltage measurements/processing circuit 108 may include a local alert processing module 134. It is recognized that in at least some cases, any one or more of the optical coupling circuit 112, comparator circuit 114, reference voltage selection circuit 116 and A2D 118 may be included as part of the certain other circuits 132 within the microcontroller 120.

In operation, particularly when the stray voltage input signal to the stray voltage measurements/processing circuit 108 may be unregulated, or otherwise unpredictable at least some of the time (e.g., lightning strike, maximum transmission line voltage, or the like), the optional optical coupling circuit 112 may be used to protect the circuitry of the stray voltage measurement/processing circuit 108.

In the embodiment of FIG. 2A, the processor 122 is arranged to execute software instructions stored in the memory 124. The execution of such instructions may include retrieving particular data stored in the memory 124, and in at least some cases the cooperation between the executing software instructions and the data stored in the memory causes the I/O module 130 to assert a selection signal on the reference voltage selection circuit 116. In at least some cases, the selection signal is applied to a multiplexor, and the selected output of the multiplexor determines a tap in a voltage divider network R5, R6, RN that sets a reference voltage, which will be applied to the comparator 118. In this way, the stray voltage signal 106 is compared against the reference voltage from the reference voltage selection circuit 116.

In at least some cases, the comparator 114 is a circuit formed using an operational amplifier and other known circuitry (not shown), and the output signal from the comparator 114 is an analog voltage signal that represents the difference between the reference voltage and the isolated stray voltage signal 106. In other cases, comparator 114 is formed as a comparator, and the output signal is a binary value indicating that the input stray voltage signal 106 has or has not exceeded the signal level of the reference voltage selection circuit 116. In either case, the output signal of the comparator 114 is converted by the A2D 118 to a digital value, which may directly represent the level of stray voltage potential or which may be used to calculate the level of stray voltage. Accordingly, software executing in the microcontroller 120 may be used to determine a discrete stray voltage level (e.g., 3 volts, 10 volts, 50 volts, 280 volts, or some other level), or software may be used to determine a relative voltage level (e.g., "safe," "moderate," "dangerous," "extremely dangerous," or the like).

In at least some cases, such as when the comparator is arranged as an operational amplifier that generates an analog value from the stray voltage signal 106, the digital value output of the A2D 118 is a saturation value, which may indicate a very high stray voltage input. In these cases, the software instructions executed by the processor 122 may provide a different selection value to the reference voltage selection circuit 116, which can then provide a different reference voltage at the comparator 114. In at least some cases, the process of identifying a proper reference voltage, and thereby determining a useful digital output from the A2D 118 is an iterative process.

In some cases, further software instructions stored in the memory 124 are arranged to analyze the determined stray voltage value. The analysis may include determining whether the stray voltage is a new condition, an evolving condition, a known existing condition, or some other condition. The analysis may alternatively, or additionally, include determining whether the stray voltage is safe, moderately safe, moderately unsafe, dangerous, extremely dangerous, or some other determination. Accordingly, based on the analysis, still further software instructions stored in the memory 124 and executed by the processor 122 may cause a local output at the device, a communication of the determined stray voltage condition, or some other action.

When the stray voltage measurements/processing circuit 108 determines, for example, a dangerous stray voltage condition, the local alert processing module 134 may be used to assert an output (e.g., an "alert") such as an audible signal in proximity to the device (e.g., via a speaker, a piezo device, a buzzer, a siren, or the like), a visual signal in proximity to the device (e.g., a solid light, a flashing light, an indication on a display, or the like), or a short-range wireless signal (e.g., WiFi, BLUETOOTH, or the like). The wireless signal may, for example, be received by all computing devices communicatively coupled (e.g., WiFi) to the device. In at least one case, for example, the device may be arranged as a public WiFi "hotspot," and all mobile computing devices that are communicatively coupled to the particular hotspot will receive the alert generated by the local alert processing module 134. In still other cases, the communication module 126 may be arranged to communicate the output (e.g., the "alert") as information representing the stray voltage condition to a remote computing device via a wired connection (e.g., Ethernet, fiber, powerline communications, or the like), a wireless connection (e.g., a communication medium that conforms to a cellular or cellular-based protocol (e.g., 4G, LTE, 5G, or the like)), or both a wired and a wireless connection.

FIGS. 2B-2D are exemplary voltage signal patterns of the stray voltage signal 106 represented over time.

In FIG. 2B, a first output signal representation of the stray voltage signal 106 from the stray voltage isolation circuit 102 of FIG. 2A is shown as a flat signal of low alternating current voltage (VAC) root-mean-square (rms). The stray voltage signal 106 in FIG. 2B is represented at about 0.n VAC rms, which may be zero volts, less than five volts, or some other "safe" value. In these cases, the stray voltage measurement/processing circuit 108 will generate and output indicating that no stray voltage is present. In some cases, the output indicating an absence of stray voltage includes an active assertion by the local alert processing module 134 (e.g., illuminating a "green" light source), an active assertion or message communicated via the communications module 126, or some other means. In other cases, an indication that no stray voltage is present includes taking no action whatsoever (e.g., de-asserting an output, leaving an output floating, or the like).

In FIG. 2C, a second output signal representation of the stray voltage signal 106 from the stray voltage isolation circuit 102 of FIG. 2A is shown as a 20 VAC rms signal. This exemplary value may not indicate an unsafe stray voltage, but it may indicate an evolving stray voltage condition. In this case, it is recognized that the stray voltage measurement/processing circuit 108 may be arranged with two or more stray voltage threshold values, wherein different thresholds may be used to trigger assertions of a first output, a second output, or any suitable number of different outputs. For example, in this case, the stray voltage measurement/ processing circuit 108 may generate an output indicating the evolving stray voltage condition via an active assertion by the local alert processing module 134 (e.g., illuminating an "amber" light source), an active assertion or message communicated immediately or at a later time via the communications module 126, or some other means.

In FIG. 2D, a third output signal representation of the stray voltage signal 106 from the stray voltage isolation circuit 102 of FIG. 2A is shown as a 50 VAC rms signal. This exemplary value may indicate an unsafe stray voltage condition. In this case, the stray voltage measurement/processing circuit 108 may be arranged to direct an active assertion (e.g., an output) by the local alert processing module 134 (e.g., illuminating an "red" light source, sounding an audible alert, or the like). Additionally, the unsafe stray voltage condition may cause stray voltage measurement/processing circuit 108 to generate an output as the communication of an immediate "alert" message via the communications module 126, or some other means.

The operation of the stray voltage measurement/processing circuit 108 provides great flexibility, including allowing a local or a remote user to program various parameters of the stray voltage detection circuitry. The remote programming may occur locally (e.g., a keyboard, mouse, monitor, or other human interface device (HID) components coupled to the input/output module 130. The remote programming may occur programmatically via commands passed through the communications module 126 that direct new values for various parameters.

The parameters, for example, may include any number of stray voltage threshold values (e.g., 10 VAC rms, 20 VAC rms, 50 VAC rms), ranges of stray voltage threshold values, and the like. In this way, immediate unsafe stray voltage conditions can be detected, and evolving stray voltage conditions can be detected. Additional parameters that may be locally or remoted set include values for any one or more of the resistors of the stray voltage detection and processing module 100, which can permit configuration of a single device for a wide variety of mains power line voltages, various digital voltages, a gain of OpAmp 110, and the like.

FIG. 3 is a processor-based device 300 mounted to light fixture 302, which itself is mounted to a light pole 304. The light fixture 302 includes a light source 306 comprising one or more lighting elements for illuminating a street, public area, or any other desirable location. The light source 306 may be an incandescent light source, a light emitting diode (LED) light source, a high-pressure sodium lamp, or any other type of light source. In the streetlight of FIG. 3, the processor-based device 300 is coupled to the light fixture 302 via a receptacle having a predetermined configuration established according to one or more standards. Certain standards provided by the National Electrical Manufacturers Association (NEMA) are directed to standards for Roadway and Area Lighting Equipment, such as ANSI C136 standards. More particularly, some NEMA standards are directed to external locking type photo-control devices for street and area lighting, such as ANSI C136.41. The receptacle of the light fixture 302 has a set of receptacle elements for engaging with a connector satisfying one or more ANSI standards to electrically and mechanically couple a photo-controller thereto.

FIG. 4A is a perspective view of a processor-based device 400. FIG. 4B is a right-side view of the processor-based device 400 of FIG. 4A. The processor-based device 400 has a cylindrically-shaped body 401 housing a processor and the circuitry 200 described herein. In other embodiments, the body of the processor-based device may have any suitable shape, size, and other characteristics. The processor-based device 400 includes a connector 402 for selectively mounting the device 400 to the NEMA receptacle of the light fixture 302. The processor-based device of FIGS. 4A, 4B may include an integrated multi-pin NEMA receptacle 404 on an upper portion thereof. Though not expressly marked, the multi-pin NEMA receptacle 404 embodiment of FIG. 4A includes three holes, which are arranged to electromechanically receive three pins of a compatible NEMA connector. For instance, the receptacle 404 may be identical to a NEMA receptacle provided on the light fixture 302. The receptacle 404 has contact elements that electrically couple with connector elements of a photo-controller having a NEMA configured connector. The connector 402 has a set of connector elements, such as pins or prongs, satisfying one or more ANSI standards, such as the ANSI C136 standard.

A photo-controller may be selectively mounted or attached to the processor-based device 400 for controlling illumination and dimming of the lighting elements of the light source 306.

Figure 5:
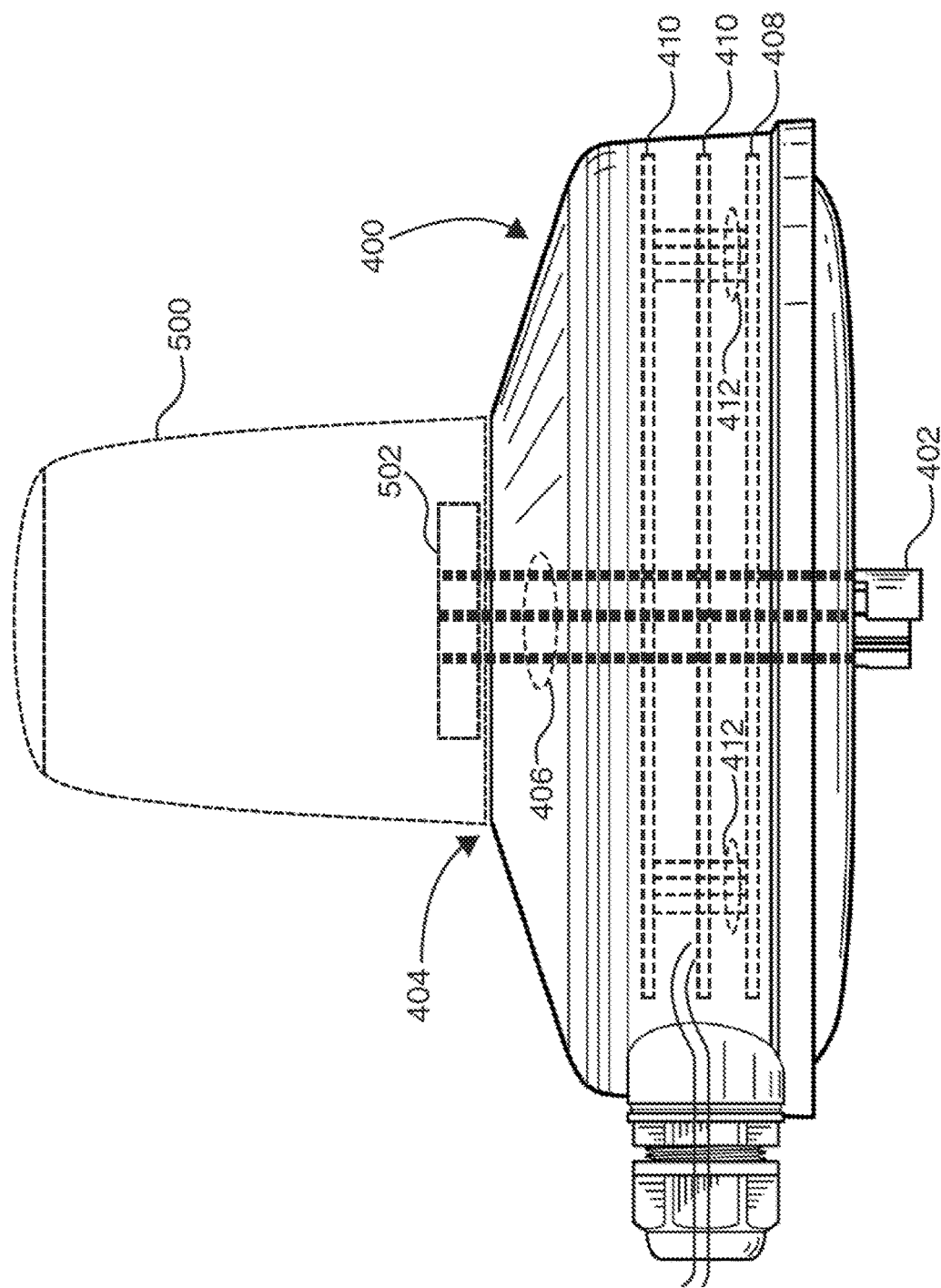
FIG. 5 is a side view of the processor-based device having a photo-control device coupled to a receptacle of the processor-based device.

FIG. 5 is an embodiment of a photo-control device 500 having a photo-controller 502 electrically coupled to connector elements of the connector 402 through the NEMA receptacle 404 (See FIG. 404). A set of electrical conduits 406 connect electrical contacts of the receptacle 404 with electrical contacts of the connector 402 for transmission of electrical power between mains power to the photo-controller 502 and for transmission of electrical control signals from the photo-controller 502 to the lighting elements of the light source 306 as a result of the photo-controller 502 detecting certain ambient lighting conditions.

A first printed-circuit board (PCB) 408 or other electrical substrate is embodied within a housing of the processor-based device 400. The first PCB 408 includes the circuit 100 described herein. The PCB 408 has electrical contacts electrically coupled to connector elements of the connector 402 to receive AC mains power when the processor-based device 400 is mounted to the light fixture 302. The processor-based device 400 includes one or more additional PCBs 410 having processors and electrical components disposed thereon that operate as independent devices, such as a small cell networking device enabled to provide services for the streetlight and services for mobile devices in proximity to this or other streetlights. In at least some cases, the small cell device is also arranged to provide still other additional services to one or more third party entities such as utilities, law enforcement, schools, and retail and wholesale businesses. The small cell device is described, for example, in U.S. Patent Application No. 62/614,918, filed Jan. 8, 2018, which is incorporated herein by reference in its entirety and International Patent Application PCT/US2019/012775, filed Jan. 8, 2019, which is incorporated by reference in its entirety.

The PCBs 410 may have peripheral devices and/or sensors coupled thereto for performing various operations. For instance, one or more PCBs 410 may include a wireless transceiver module providing wireless communication capability to any one or more devices having corresponding wireless transceivers. In some cases, for example, using functionality provided by the wireless transceiver module, the wireless transceiver module operates as a WiFi access point. In this way, the processor-based device 400 permits one or more mobile devices to access the internet. Municipalities or other entities may make internet services available over a determined geographic area (e.g., a neighborhood, a city, an arena, a construction site, a campus, or the like) to remote mobile devices that are in proximity to any one of a plurality of processor-based devices 200. For example, if many streetlight fixtures in a neighborhood or city are equipped with a small cell networking device, then WiFi service can be provided to a large number of users. What's more, based on seamless communication between a plurality of small cell networking devices, the WiFi service can be configured as a mesh that permits users to perceive constant internet connectivity even when the mobile device is in motion. These and other devices described in U.S. Patent Application No. 62/614,918 may be included in, associated with, or coupled to the PCBs 410. In some embodiments, the processor-based device 400 may not have the receptacle 404 and may instead include a photo-controller and associated photosensor for controlling illumination and dimming of the light source 306.

A circuit on the PCB 408 converts the AC mains power into DC power that powers the devices of PCB 408 and devices of the PCBs 410. The circuitry generates, derives, or otherwise provides DC power output and a digitally stable ground to the PCBs 408, 410 and/or associated devices via one or more coupling structures 412, such as electrically conductive cables or wires, comprising a power bus. The coupling structures may include wires or other types of electrical conduits. The coupling structures may also include pins, receptacles, housings, standoffs, bushings, contacts, and other suitable electrical, mechanical, or electromechanical structures. The DC power output may have a DC voltage with a level and stability that safely powers digital circuits and/or processors (e.g., 1.8 VDC, 3.3 VDC, 5 VDC, 10 VDC, 12 VDC). The AC mains power level, which is converted into a DC power signal, may be 60 VAC, 120 VAC, 230 VAC, 240 VAC, 400 VAC, or some other AC voltage, and the AC mains power may have a frequency of 60 Hertz or 50 Hertz, by way of non-limiting example. In some embodiments, other signals are also passed through the multi-pin NEMA receiver 404 and the multi-pin NEMA connector 402. The multi-pin NEMA devices may include one or more contacts to pass these other signals, which may include a plurality of low power direct current (e.g., 0 VDC to 10 VDC) dimming control signals or other control signals. In at least some embodiments, a stray voltage detector 10 (FIG. 1) or a stray voltage detection and processing module 100 is arranged on PCB 408.

Figure 6:
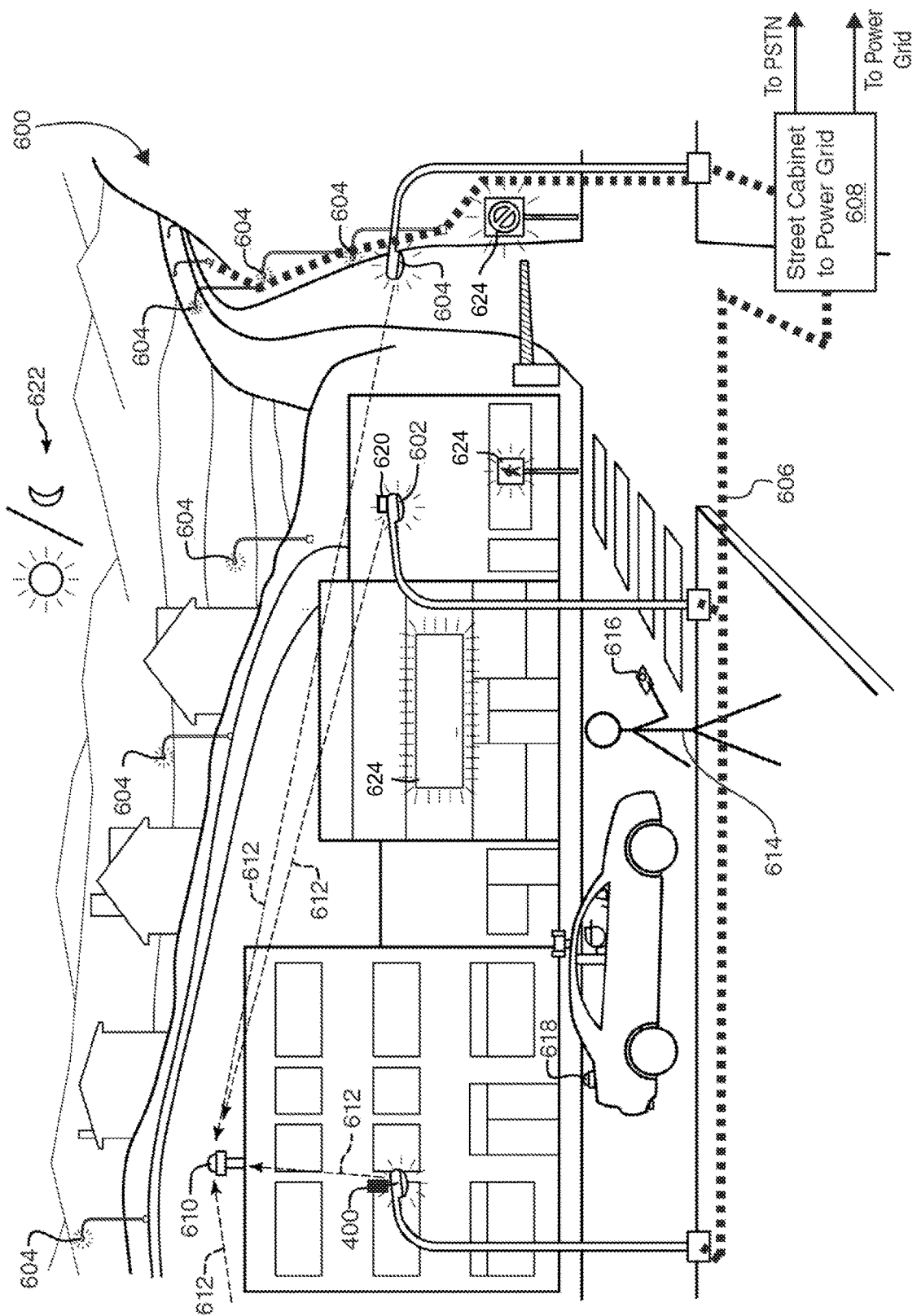
FIG. 6 is a system level deployment having at least one small cell networking device and a plurality of smart sensor devices coupled to streetlight fixtures.

FIG. 6 is a system level deployment 600 having at least one processor-based device 400 (e.g., small cell networking device) and a plurality of smart sensor devices 620 coupled to streetlight fixtures 604. The streetlight fixtures 604 are coupled to or otherwise arranged as part of a system of streetlight poles, each streetlight fixture 604 includes a light source 602. Each light source, light fixture, and light fitting, individually or along with their related components, may in some cases be interchangeably referred to as a luminaire, a light source, a streetlight, a streetlamp, or some other such suitable term. To avoid unnecessarily crowding FIG. 6, individual smart sensor devices 620 are not identified on streetlight fixtures 604, however it is recognized that such smart sensor devices 620, or such processor-based devices 400, may be coupled to any number of streetlight fixtures 604 (e.g., all streetlight fixtures 604, every other streetlight fixture, every Nth streetlight fixture, or some other number of streetlight fixtures).

As shown in the system level deployment 600, a plurality of light poles are arranged in one or more determined geographic areas, and each light pole has at least one light source 602 positioned in a streetlight fixture 604. The fixture is at least twenty feet above ground level and in at least some cases, the fixtures are between about 20 feet and 40 feet above ground level. In other cases, the streetlight fixtures may of course be lower than 20 feet above the ground or higher than 40 feet above the ground.

The system of streetlight poles, streetlight fixtures, streetlight sources, or the like in the system level deployment may be controlled by a municipality or other government agency. In other cases, the system of streetlight poles, streetlight fixtures, streetlight sources, or the like in the system level deployment is controlled by a private entity (e.g., private property owner, third-party service contractor, or the like). In still other cases, a plurality of entities share control of the system of streetlight poles, streetlight fixtures, streetlight sources, or the like. The shared control may be hierarchical or cooperative in some other fashion. For example, when the system is controlled by a municipality or a department of transportation, an emergency services agency (e.g., law enforcement, medical services, fire services) may be able to request or otherwise take control of the system. In still other cases, one or more sub-parts of the system of streetlight poles, streetlight fixtures, streetlight sources, or the like can be granted some control such as in a neighborhood, around a hospital or fire department, in a construction area, or in some other manner.

In the system level deployment 600 of FIG. 6, any number of streetlight fixtures 604 may be arranged with a connector that is compliant with a roadway area lighting standard promoted by a standards body. The connector permits the controlling or servicing authority of the system to competitively and efficiently purchase and install light sensors on each streetlight fixture. In addition, or in the alternative, the standardized connector in each streetlight fixture permits the controlling or servicing authority to replace conventional light sensors with other devices such as a small cell networking device, a smart sensor device 620, or some other device.

Figure 4:
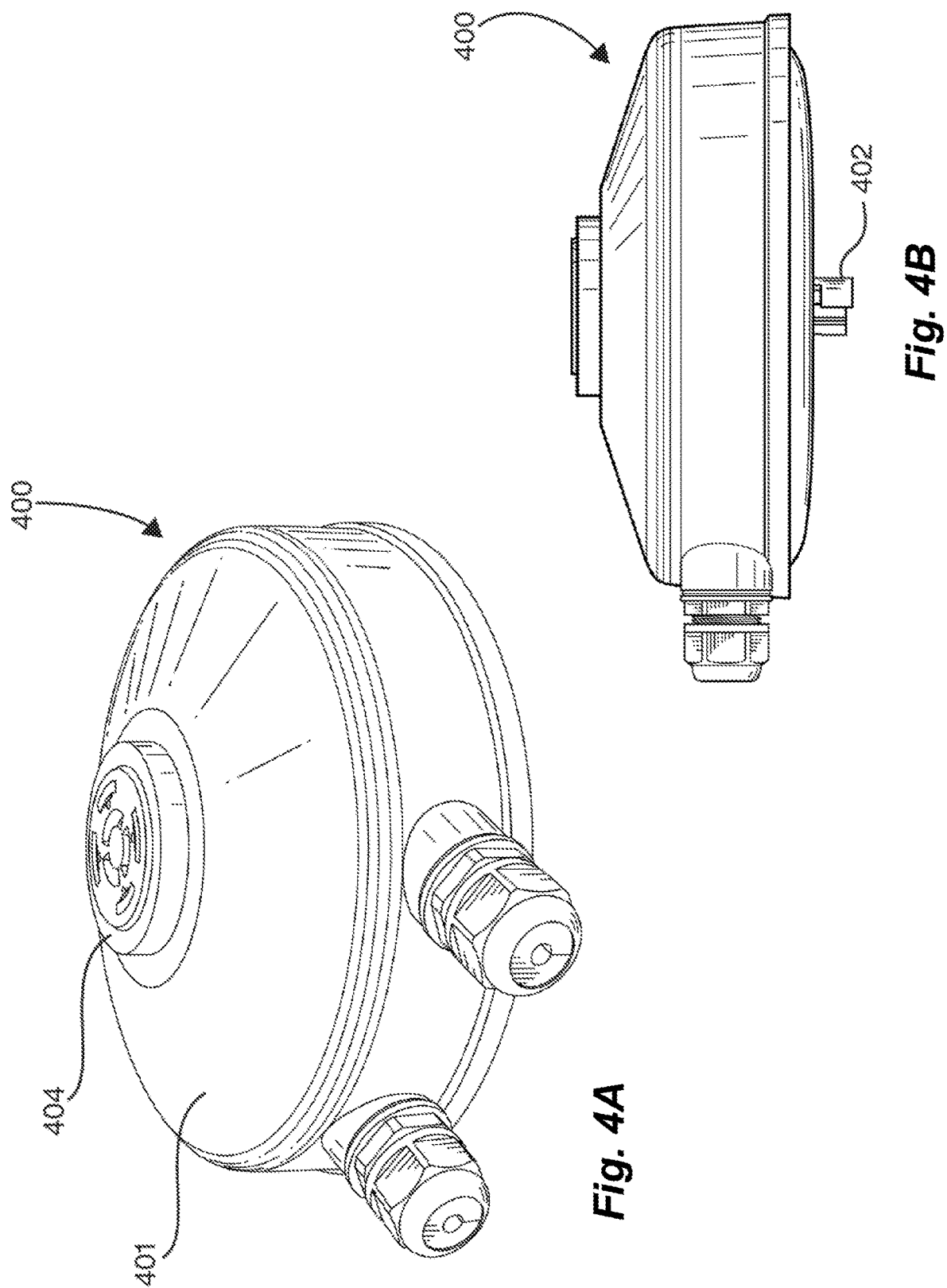
FIG. 4A is a perspective view of the processor-based device of FIG. 3.
FIG. 4B is a right-side view of the processor-based device of FIG. 4A.

In the system level deployment 600, a small cell networking device is electromechanically coupled to a selected light pole wherein the electromechanical coupling is performed via the connector that is compliant with the roadway area lighting standard promoted by a standards body (e.g., connector 402 and/or receptacle 404 of FIG. 4). Stated differently, the system level deployment 600 includes at least one light pole and fixture with a small cell networking device, and a plurality of light poles each having a smart sensor device(s) 620. In these light poles of the system level deployment 600, each streetlight fixture 604 is equipped with a standalone smart device such as the smart sensor device 620 that is electromechanically coupled via a respective connector that is compliant with the roadway area lighting standard promoted by the standards body. In this arrangement, each streetlight 602, 604 is equipped with a light sensor that is further electrically coupled to a processor-based light control circuit. In other deployments, less than all streetlight fixtures 604 will be equipped with the smart sensor devices 620 or small cell networking devices described herein.

The processor-based light control circuit of each smart device is arranged to provide a light control signal to the respective light source based on at least one ambient light signal generated by its associated the light sensor. In addition, because each streetlight 602, 604 is equipped with communication capabilities, each light source in each streetlight 602, 604 can be controlled remotely as an independent light source or in combination with other light sources. In these cases, each of the plurality of light poles and fixtures with a smart sensor device 620 is communicatively coupled to the light pole and fixture with a small cell networking device (i.e., a processor-based device 400). The communicative relationship from each of the plurality of light poles and fixtures with a smart sensor device 620 to the light pole and fixture with a small cell networking device may be a direct communication or an indirect communication. That is, in some cases, one of the plurality of light poles and fixtures with a smart sensor device 620 may communicate directly to the light pole and fixture with a small cell networking device or the one of the plurality of light poles and fixtures with a smart sensor device 620 may communicate via one or more other ones of the plurality of light poles and fixtures with a smart sensor device 620, and the data of the communications may be passed through any number of smart sensor devices in a path to reach a fixture having a processor-based device 400 (e.g., small cell networking device).

In the system level deployment 600 of FIG. 6, various ones of the light poles may be 50 feet apart, 100 feet apart, 250 feet apart, or some other distance. In some cases, the type and performance characteristics of each small cell networking device 602 and each smart sensor device 620 are selected based on their respective distance to other such devices such that wireless communications are acceptable.

The light pole and fixture with a processor-based device 400 (e.g., small cell networking device) and each light pole and fixture with a smart sensor device 620 is coupled to a street cabinet 608 or other like structure that provides utility power (e.g., "the power grid") in a wired way. The utility power may provide 120 VAC, 240 VAC, 260 VAC, or some other power source voltage. In addition, the light pole and fixture with a small cell networking device 602, and optionally one or more of the light poles and fixtures with smart sensor devices 604, are also coupled to the same street cabinet 608 or another structure via a wired backhaul connection. It is understood that these wired connections are in some cases separate wired connections (e.g., copper wire, fiber optic cable, industrial Ethernet cable, or the like) and in some cases combined wired connections (e.g., power over Ethernet (PoE), powerline communications, or the like). For simplification of the system level deployment 600 of FIG. 6, the wired backhaul and power line 606 is illustrated as a single line. The street cabinet 608 is coupled to the power grid, which is administered by a licensed power utility agency, and the street cabinet 608 is coupled to the public switched telephone network (PSTN).

Each light pole and fixture 604 with a smart sensor device 620 is in direct or indirect wireless communication with the light pole and fixture with the processor-based device 400 (e.g., small cell networking device). In addition, each light pole and fixture with a smart sensor device 620 and the light pole and fixture with the processor-based device 400 (e.g., small cell networking device) may also be in direct or indirect wireless communication 612 with an optional remote computing device 610.

The remote computing device 610 may be controlled by a mobile network operator (MNO), a municipality, another government agency, a third party, or some other entity. By this optional arrangement the remote computing device 610 can be arranged to wirelessly communicate light control signals and any other information (e.g., packetized data) between itself and each respective wireless networking device coupled to any of the plurality of light poles.

A user 614 holding a mobile computing device 616 is represented in the system level deployment 600 of FIG. 6. A vehicle having an in-vehicle mobile device 618 is also represented. The vehicle may be an emergency service vehicle, a passenger vehicle, a commercial vehicle, a public transportation vehicle, a drone, or some other type of vehicle. The user 614 may use their mobile computing device 616 to establish a wireless communication session over a cellular-based network controlled by an MNO, wherein packetized wireless data is passed through the light pole and fixture with a processor-based device 400 (e.g., small cell networking device). Concurrently, the in-vehicle mobile device 618 may also establish a wireless communication session over the same or a different cellular-based network controlled by the same or a different MNO, wherein packetized wireless data of the second session is also passed through the light pole and fixture with the processor-based device 400 (e.g., small cell networking device).

Other devices may also communicate through light pole-based devices of the system level deployment 600. These devices may be internet of things (IoT) devices or some other types of devices. In FIG. 6, two public information signs and/or a private entity signs are shown, but many other types of devices are contemplated. Each one of these devices has or may otherwise include a smart computing device arranged to form an unlicensed wireless communication session (e.g., WiFi) or a cellular-based wireless communication session with one or more wireless networks made available by the devices shown in the system level deployment 600 of FIG. 6.

The sun and moon 622 are shown in FIG. 6. Light or the absence of light based on time of day, weather, geography, or other causes provide information (e.g., ambient light) to the light sensors of the light pole mounted devices described in the present disclosure. Based on this information, the associated light sources may be suitably controlled.

Figure 7:
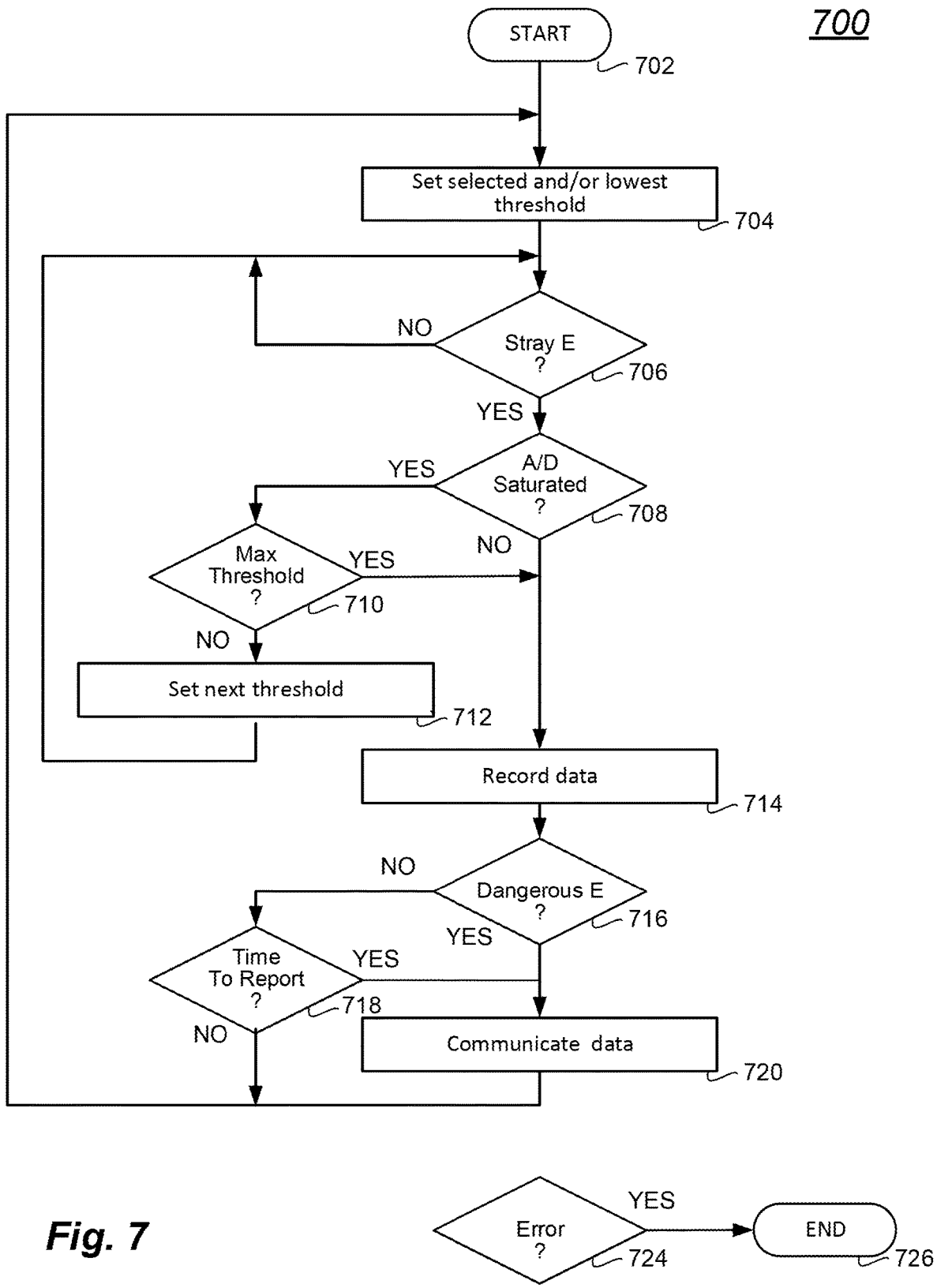
FIG. 7 is a data flow diagram representing processing associated with the stray voltage detection circuit.

FIG. 7 is a data flow diagram (e.g., a flowchart) representing processing associated with the stray voltage detection circuit 100 (FIG. 2A). The processing begins at 702 where the stray voltage detection module is initialized. The initialization may include setting default variable values, configuring the input/output module 130 of microcontroller 120 to communicate with the reference voltage selection circuit 116, configuring the input/output module 130 of microcontroller 120 to output one or more signals if a stray voltage signal 106 is detected as reaching or crossing a certain threshold, configuring a communications module 126 (e.g., serial or other data transfer port) to communicate with the analog-to-digital (A2D) 118 module, and the like. Processing falls to 704.

At 704, the microcontroller 120 directs a signal to the reference voltage selection circuit 116 to assert a selected reference voltage on the comparator 114. In at least one case, the reference voltage selection circuit 116 is directed to assert a lowest threshold voltage value on the comparator 114.

An output signal from the comparator 114 is sampled by the A2D 118 at 706. The output of the A2D 118 is a digital representation of the amount of stray voltage determined to be present on the neutral line of the device at issue. If no stray voltage is detected, or if any stray voltage is below a particular threshold (e.g., a determined "safe" value), processing continues cyclically in 706. The processing may be interrupt driven, timer driven, or driven in some other way.

If a stray voltage is detected (e.g., if a stray voltage of any amount), the processing advances to 708 where the value produced by the A2D 118 is evaluated. If the value is a saturation value, then the detected stray voltage input is significantly greater than the A2D 118 can represent. The circuit will, in at least some embodiments, attempt to scale the threshold to more accurately determine the amount of stray voltage present on the neutral power line by passing control to 710. Alternatively, if the A2D 118 is not saturated (i.e., the A2D 118 represents a determined voltage value), processing passes from 708 to 714.

In the processing at 710, the current threshold reference voltage coupled to the comparator 114 is evaluated. If the threshold is not at its greatest selected value, then the next higher threshold value is selected, and processing returns to 706 for ongoing stray voltage detection. Alternatively, if the threshold voltage applied to the comparator 114 at its greatest selected value, then the stray voltage value will be determined as a maximum value.

At 714, one or more stray voltage values are optionally recorded. The stray voltage values may be coupled with location data (e.g., global positioning system data), time data, rate of change data, and other such data associated with the stray voltage. In this way, it is recognized that the stray voltage detection and processing module 100 of FIG. 2A may be arranged to detect rising stray voltage (e.g., from deteriorating insulation or other slowly occurring failures), and the stray voltage detection and processing module 100 of FIG. 2A may be further arranged to detect rapidly rising stray voltage (e.g., a power pole is compromised by an automobile accident). Depending on the type of stray voltage detected, the microcontroller 120 may be arranged to classify with the stray voltage, for example as "safe," "monitor," "dangerous," or the like.

After recording any suitable number of parameters associated with the detected stray voltage at 714, the danger level of the stray voltage is determined at 716. If the voltage has not crossed a selected safety threshold (e.g., "dangerous", greater than a selected voltage, or the like), processing advances to 718. Alternatively, processing advances to 720.

At 718, if stray voltage reporting is based on a particular schedule, cycle, or other time parameter, then the elapsed time since a previous reporting is evaluated. If the system will report particular determinations made by or otherwise associated with the stray voltage detection and processing module 100, processing passes to 720. Alternatively, processing advances back to 704. Processing of the stray voltage detection circuit is ongoing.

The processing at 720 may include locally reporting a dangerous condition. The local reporting may include any one or more of illuminating a light source as a warning that the associated power pole or other structure may be electrified, activating an audible output warning, transmitting a wireless (e.g., 802.11 WiFi, BLUETOOTH, or the like) warning to all nearby computing devices capable of receiving such a signal, or providing some other local reporting. The processing at 720 may additionally or alternatively include communicating stray voltage information to a remote computing device in a wired, wireless, or wired and wireless manner.

After performing certain communication acts at 720, processing of the stray voltage detection circuit is ongoing and returns to 704. In some cases, where an error is detected (e.g., an uncorrectable error) at 724, processing of the stray voltage detection and processing module 100 is terminated.

Having now set forth certain embodiments, further clarification of certain terms used herein may be helpful to providing a more complete understanding of that which is considered inventive in the present disclosure.

Mobile network operators (MNOs) provide wireless cellular-based services in accordance with one or more cellular-based technologies. As used in the present disclosure, "cellular-based" should be interpreted in a broad sense to include any of the variety of technologies that implement wireless or mobile communications. Exemplary cellular-based systems include, but are not limited to, time division multiple access ("TDMA") systems, code division multiple access ("CDMA") systems, and Global System for Mobile communications ("GSM") systems. Some others of these technologies are conventionally referred to as UMTS, WCDMA, 4G, 5G, and LTE. Still other cellular-based technologies are also known now or will be known in the future. The underlying cellular-based technologies are mentioned here for a clearer understanding of the present disclosure, but the inventive aspects discussed herein are not limited to any particular cellular-based technology.

In some cases, cellular-based voice traffic is treated as digital data. In such cases, the term "voice-over-Internet-Protocol", or "VoIP," may be used to mean any type of voice service that is provided over a data network, such as an Internet Protocol (IP) based network. The term VoIP is interpreted broadly to include any system wherein a voice signal from a mobile computing device is represented as a digital signal that travels over a data network. VoIP then may also include any system wherein a digital signal from a data network is delivered to a mobile computing device where it is later delivered as an audio signal.

Connector devices of the types described herein are also commonly referred to as NEMA devices, NEMA compatible devices, NEMA compliant devices, or the like. And these devices include receptacles, connectors, sockets, holders, components, etc. Hence, as used in the present disclosure and elsewhere, those of skill in the art will recognize that coupling the term "NEMA" or the term "ANSI" with any such device indicates a device or structure compliant with a standard promoted by a standards body such as NEMA, ANSI, IEEE, or the like.

A mobile device, or mobile computing device, as the terms are used interchangeably herein, is an electronic device provisioned by at least one mobile network operator (MNO) to communicate data through the MNO's cellular-based network. The data may be voice data, short message service (SMS) data, electronic mail, world-wide web or other information conventionally referred to as "internet traffic," or any other type of electromagnetically communicable information. The data may be digital data or analog data. The data may be packetized or non-packetized. The data may be formed or passed at a particular priority level, or the data may have no assigned priority level at all. A non-comprehensive, non-limiting list of mobile devices is provided to aid in understanding the bounds of the term, "mobile device," as used herein. Mobile devices (i.e., mobile computing devices) include cell phones, smart phones, flip phone, tablets, phablets, handheld computers, laptop computers, body-worn computers, and the like. Certain other electronic equipment in any form factor may also be referred to as a mobile device when this equipment is provisioned for cellular-based communication on an MNO's cellular-based network. Examples of this other electronic equipment include in-vehicle devices, medical devices, industrial equipment, retail sales equipment, wholesale sales equipment, utility monitoring equipment, and other such equipment used by private, public, government, and other entities.

Mobile devices further have a collection of input/output ports for passing data over short distances to and from the mobile device. For example, serial ports, USB ports, WiFi ports, Bluetooth ports, IEEE 1394 FireWire, and the like can communicatively couple the mobile device to other computing apparatuses.

Mobile devices have a battery or other power source, and they may or may not have a display. In many mobile devices, a signal strength indicator is prominently positioned on the display to provide network communication connectivity information to the mobile device user.

A cellular transceiver is used to couple the mobile device to other communication devices through the cellular-based communication network. In some cases, software and data in a file system are communicated between the mobile device and a computing server via the cellular transceiver. That is, bidirectional communication between a mobile device and a computing server is facilitated by the cellular transceiver. For example, a computing server may download a new or updated version of software to the mobile device over the cellular-based communication network. As another example, the mobile device may communicate any other data to the computing server over the cellular-based communication network.

Each mobile device client has electronic memory accessible by at least one processing unit within the device. The memory is programmed with software that directs the one or more processing units. Some of the software modules in the memory control the operation of the mobile device with respect to generation, collection, and distribution or other use of data. In some cases, software directs the collection of individual datums, and in other cases, software directs the collection of sets of data.

Software may include a fully executable software program, a simple configuration data file, a link to additional directions, or any combination of known software types. When the computing server updates software, the update may be small or large. For example, in some cases, a computing server downloads a small configuration data file to as part of software, and in other cases, computing server completely replaces all of the present software on the mobile device with a fresh version. In some cases, software, data, or software and data is encrypted, encoded, and/or otherwise compressed for reasons that include security, privacy, data transfer speed, data cost, or the like.

Processing devices, or "processors," as described herein, include central processing units (CPU's), microprocessors, microcontrollers (MCU), digital signal processors (DSP), application specific integrated circuits (ASIC), state machines, and the like. Accordingly, a processor as described herein includes any device, system, or part thereof that controls at least one operation, and such a device may be implemented in hardware, firmware, or software, or some combination of at least two of the same. The functionality associated with any particular processor may be centralized or distributed, whether locally or remotely. A processor may interchangeably refer to any type of electronic control circuitry configured to execute programmed software instructions. The programmed instructions may be high-level software instructions, compiled software instructions, assembly-language software instructions, object code, binary code, micro-code, or the like. The programmed instructions may reside in internal or external memory or may be hard-coded as a state machine or set of control signals. According to methods and devices referenced herein, one or more embodiments describe software executable by the processor, which when executed, carries out one or more of the method acts.

As known by one skilled in the art, a computing device, including a mobile computing device, has one or more memories, and each memory may comprise any combination of volatile and non-volatile computer-readable media for reading and writing. Volatile computer-readable media includes, for example, random access memory (RAM). Non-volatile computer-readable media includes, for example, any one or more of read only memory (ROM), magnetic media such as a hard-disk, an optical disk, a flash memory device, a CD-ROM, and the like. In some cases, a particular memory is separated virtually or physically into separate areas, such as a first memory, a second memory, a third memory, etc. In these cases, it is understood that the different divisions of memory may be in different devices or embodied in a single memory. Some or all of the stored contents of a memory may include software instructions executable by a processing device to carry out one or more particular acts.

In the present disclosure, memory may be used in one configuration or another. The memory may be configured to store data. In the alternative or in addition, the memory may be a non-transitory computer readable medium (CRM) wherein the CRM is configured to store instructions executable by a processor. The instructions may be stored individually or as groups of instructions in files. The files may include functions, services, libraries, and the like. The files may include one or more computer programs or may be part of a larger computer program. Alternatively, or in addition, each file may include data or other computational support material useful to carry out the computing functions of the systems, methods, and apparatus described in the present disclosure.

FIG. 7 is a data flow diagram (e.g., a flowchart) 700 illustrating processes that may be used by embodiments of computing devices such as the processor-based device 400 of FIG. 4 and other such devices disclosed herein. In this regard, each described process may represent a module, segment, or portion of code, which comprises one or more executable instructions for implementing the specified logical function(s). It should also be noted that in some implementations, the functions noted in the process may occur in a different order, may include additional functions, may occur concurrently, and/or may be omitted.

As used in the present disclosure, the term "module" refers to an application specific integrated circuit (ASIC), an electronic circuit, a processor and a memory operative to execute one or more software or firmware programs, combinational logic circuitry, or other suitable components (hardware, software, or hardware and software) that provide the functionality described with respect to the module.

The terms, "real-time" or "real time," as used herein and in the claims that follow, are not intended to imply instantaneous processing, transmission, reception, or otherwise as the case may be. Instead, the terms, "real-time" and "real time" imply that the activity occurs over an acceptably short period of time (e.g., over a period of microseconds or milliseconds), and that the activity may be performed on an ongoing basis (e.g., recording and reporting the collection of utility grade power metering data, recording and reporting IoT data, crowd control data, anomalous action data, and the like). An example of an activity that is not real-time is one that occurs over an extended period of time (e.g., hours or days)] or that occurs based on intervention or direction by a person or other activity.

In the absence of any specific clarification related to its express use in a particular context, where the terms "substantial" or "about" in any grammatical form are used as modifiers in the present disclosure and any appended claims (e.g., to modify a structure, a dimension, a measurement, or some other characteristic), it is understood that the characteristic may vary by up to 30 percent. For example, a small cell networking device may be described as being mounted "substantially horizontal," In these cases, a device that is mounted exactly horizontal is mounted along an "X" axis and a "Y" axis that is normal (i.e., 90 degrees or at right angle) to a plane or line formed by a "Z" axis. Different from the exact precision of the term, "horizontal," and the use of "substantially" or "about" to modify the characteristic permits a variance of the particular characteristic by up to 30 percent. As another example, a small cell networking device having a particular linear dimension of between about six (6) inches and twelve (12) inches includes such devices in which the linear dimension varies by up to 30 percent. Accordingly, the particular linear dimension of the small cell networking device may be between 2.4 inches and 15.6 inches.

The terms "include" and "comprise" as well as derivatives thereof, in all of their syntactic contexts, are to be construed without limitation in an open, inclusive sense, (e.g., "including, but not limited to"). The term "or," is inclusive, meaning and/or. The phrases "associated with" and "associated therewith," as well as derivatives thereof, can be understood as meaning to include, be included within, interconnect with, contain, be contained within, connect to or with, couple to or with, be communicable with, cooperate with, interleave, juxtapose, be proximate to, be bound to or with, have, have a property of, or the like.

Unless the context requires otherwise, throughout the specification and claims which follow, the word "comprise" and variations thereof, such as, "comprises" and "comprising," are to be construed in an open, inclusive sense, e.g., "including, but not limited to."

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity as the case may be. In addition, the composition of "and" and "or" when recited herein as "and/or" is intended to encompass an embodiment that includes all of the associated items or ideas and one or more other alternative embodiments that include fewer than all of the associated items or ideas.

In the present disclosure, conjunctive lists make use of a comma, which may be known as an Oxford comma, a Harvard comma, a serial comma, or another like term. Such lists are intended to connect words, clauses or sentences such that the thing following the comma is also included in the list.

As described herein, for simplicity, a user is in some case described in the context of the male gender. For example, the terms "his," "him," and the like may be used. It is understood that a user can be of any gender, and the terms "he," "his," and the like as used herein are to be interpreted broadly inclusive of all known gender definitions.

As the context may require in this disclosure, except as the context may dictate otherwise, the singular shall mean the plural and vice versa; all pronouns shall mean and include the person, entity, firm or corporation to which they relate; and the masculine shall mean the feminine and vice versa.

When so arranged as described herein, each computing device may be transformed from a generic and unspecific computing device to a combination device comprising hardware and software configured for a specific and particular purpose. When so arranged as described herein, to the extent that any of the inventive concepts described herein are found by a body of competent adjudication to be subsumed in an abstract idea, the ordered combination of elements and limitations are expressly presented to provide a requisite inventive concept by transforming the abstract idea into a tangible and concrete practical application of that abstract idea.

The use of the phrase "set" (e.g., "a set of items") or "subset," unless otherwise noted or contradicted by context, is to be construed as a nonempty collection comprising one or more members.

The headings and Abstract of the Disclosure provided herein are for convenience only and do not limit or interpret the scope or meaning of the embodiments.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

Various devices that utilize the circuits and modules of the present disclosure are described in U.S. Patent Application No. 62/614,918, filed Jan. 8, 2018, which is incorporated herein by reference in its entirety to the fullest extent allowed by law.

Various devices that utilize the circuits and modules of the present disclosure are described in International Patent Application PCT/US2019/012775, filed Jan. 8, 2019, which is incorporated by reference in its entirety to the fullest extent allowed by law.

The stray voltage detection circuit of FIG. 1 is along the lines of a stray voltage detection circuit disclosed in U.S. patent application Ser. No. 16/569,467, (the '467 Application), which is entitled "CIRCUITRY FOR PROVIDING DIGITALLY STABLE GROUND," which application was filed Sep. 12, 2019, and which shares inventorship with inventors in the present case. The '467 Application claims priority to U.S. Provisional Patent Application No. 62/730,365, (the '365 Application) and both the '467 Application and '365 Application are incorporated herein by reference in their entirety to the fullest extent allowed by law.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A processor-based device comprising:
a chassis having a chassis ground node arranged to electrically couple the chassis to an earth ground;
a first connector accessible from an exterior of the chassis, the first connector including a set of first connector elements arranged to interface with a corresponding set of second connector elements of a second connector, wherein the first and second connector elements include a plurality of electrical signal conduits, wherein the first and second connectors conform to a powerline interface, and wherein the powerline interface includes at least a hot power signal, a load power signal, and a neutral power signal;

a processor-based apparatus housed at least in part within the chassis, the processor-based apparatus arranged to operate using direct current (DC) power derived from alternating current (AC) power present at the powerline interface; and a stray voltage detector to detect, when the powerline interface is energized, a stray voltage potential between the neutral power signal of the powerline interface and the chassis ground node, wherein the processor-based device is further arranged to communicate at least one indication of the detected stray voltage potential.

2. The processor-based device of claim 1, wherein the powerline interface conforms to a standard provided by the National Electrical Manufacturers Association (NEMA).

3. The processor-based device of claim 1, wherein the second connector is integrated in a luminaire.

4. The processor-based device of claim 1, wherein the stray voltage detector comprises:

a stray voltage isolation circuit; and a stray voltage measurement/processing circuit arranged to receive an output signal from the stray voltage isolation circuit and further arranged to assert an output when the output signal from the stray voltage isolation circuit crosses a threshold.

5. The processor-based device of claim 4, wherein the stray voltage isolation circuit comprises:

an operational amplifier having an inverting input node, a non-inverting input node, and an output node, the operational amplifier configured to amplify a difference in voltage between the inverting input node and the non-inverting input node.

6. The processor-based device of claim 5, wherein the inverting input node of the operational amplifier is electrically coupled to the chassis ground node and wherein the non-inverting input node of the operational amplifier is electrically coupled to the neutral power signal.

7. The processor-based device of claim 4, wherein the stray voltage isolation circuit comprises:

a ground reference protection circuit arranged to electrically separate a digital circuit ground plane of the stray voltage detector from the chassis ground node.

8. The processor-based device of claim 4, wherein the stray voltage isolation circuit comprises:

at least one Zener diode electrically coupled to the output node of the operational amplifier.

9. The processor-based device of claim 4, wherein the stray voltage measurement/processing circuit is arranged to set a stray voltage threshold, determine when the stray voltage potential has crossed the stray voltage threshold, and communicate an alert based on the determination.

10. The processor-based device of claim 9, wherein the alert includes at least one of an audio alert, a visual alert, and a short-range wireless alert.

11. The processor-based device of claim 9, wherein the alert includes at least one packetized message communicated toward a remote computing device via a cellular-based communication medium.

12. An apparatus arranged for attachment to a luminaire of a streetlight, the luminaire having one or more light emitting elements and a receptacle that conforms to a powerline interface, the apparatus comprising:

a housing connected to a chassis ground;

a connector accessible from an exterior of the housing, the connector including a set of connector elements that interface with corresponding receptacle elements of the receptacle of the luminaire;

one or more processor-based devices housed at least in part within the housing, the one or more processor-based devices being operable by receiving direct current power relative to a digitally stable ground; and circuitry within the housing for detecting a stray voltage between the chassis ground and a neutral power line signal passed through the connector.

13. The apparatus of claim 12, wherein at least one of the one or more processor-based devices is a wireless communications transceiver for sending and receiving wireless communication signals.

14. The apparatus of claim 12, wherein at least one of the one or more processor-based devices is a camera.

15. The apparatus of claim 12, further comprising:

one or more sensors communicatively coupled to the one or more processor-based devices.

16. The apparatus of claim 12, further comprising:

a switching element; and a photosensor arranged to provide an output that selectively causes the switching element to transition between a first state and a second state.

17. The apparatus of claim 12, wherein the connector is compliant with American National Standards Institute (ANSI) C136.

18. A method comprising:

receiving, by a processor-based device, a hot power signal, a load power signal, and a neutral power signal passed via a connector;

producing a stray voltage signal with an operational amplifier by differentially amplifying at least a portion of the neutral power signal applied at a first input of the operational amplifier and at least a portion of an earth/chassis ground potential applied at a second input of the operational amplifier;

detecting when the stray voltage signal or a representation of the stray voltage signal crosses a threshold; and asserting, by the processor-based device, an output based on the detecting.

19. The method of claim 18, comprising:

coupling the processor-based device to a receptacle of a luminaire.

20. The method of claim 18, wherein asserting an output comprises at least one of:

directing a light source to illuminate;

directing an audio source to produce an alert sound; and communicating at least one packetized message toward a remote computing device via a cellular-based communication medium.

* * * * *